(12) United States Patent
Suzuki et al.

(10) Patent No.: US 8,773,832 B2
(45) Date of Patent: Jul. 8, 2014

(54) POWER SUPPLY APPARATUS

(75) Inventors: Akihiro Suzuki, Chiyoda-ku (JP);
Hitoshi Kidokoro, Chiyoda-ku (JP);
Toshiki Koshimae, Chiyoda-ku (JP);
Hiroshi Kurushima, Chiyoda-ku (JP);
Masato Matsubara, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 326 days.

(21) Appl. No.: 13/201,524

(22) PCT Filed: Apr. 14, 2009

(86) PCT No.: PCT/JP2009/057528
§ 371 (c)(1),
(2), (4) Date: Aug. 15, 2011

(87) PCT Pub. No.: WO2010/119514
PCT Pub. Date: Oct. 21, 2010

(65) Prior Publication Data
US 2011/0299208 A1 Dec. 8, 2011

(51) Int. Cl.
*H02H 3/20* (2006.01)
(52) U.S. Cl.
USPC .......................................... 361/91.5; 361/91.1
(58) Field of Classification Search
CPC ........................................................ H02H 3/20
See application file for complete search history.

(56) References Cited

U.S. PATENT DOCUMENTS 5,495,149 A * 2/1996 Hiramatsu et al. ........ 315/209 R
7,965,508 B2 * 6/2011 Yamamoto et al. ............ 361/699
2001/0015475 A1 * 8/2001 Sharples ........................ 257/577
2006/0244116 A1 * 11/2006 Tsunoda ........................ 257/678
2008/0239663 A1 * 10/2008 Yamamoto et al. ............ 361/691
2010/0007293 A1 * 1/2010 Meadors et al. ............... 318/139
2010/0101878 A1 * 4/2010 Yoshida et al. ............. 180/65.31
2010/0304201 A1 * 12/2010 Caumont et al. .............. 429/120
2011/0057713 A1 * 3/2011 Kawanami et al. ........... 327/427
2012/0014059 A1 * 1/2012 Zeng et al. .................... 361/690
2012/0257431 A1 * 10/2012 Suzuki et al. ................. 363/132

FOREIGN PATENT DOCUMENTS

| JP | 63-7171 A | 1/1988 |
| JP | 11-89248 A | 3/1990 |
| JP | 10-229680 A | 8/1998 |
| JP | 2003-243749 A | 8/2003 |
| JP | 2003-338695 A | 11/2003 |
| JP | 2009-27840 A | 2/2009 |

* cited by examiner

*Primary Examiner* — Rexford Barnie
*Assistant Examiner* — Angela Brooks
(74) *Attorney, Agent, or Firm* — Sughrue Mion, PLLC

(57) ABSTRACT

Included are: a circuit-specific printed circuit board to be a circuit board that generates a power supply voltage; a first diode that is connected in antiparallel with the transistor and is configured so as to be capable of passing a current through a path to circumvent the transistor; a second diode that is connected in series to the transistor and prevents a current flow through a parasitic diode formed on the transistor; a protection circuit that is connected in parallel with the second diode to protect the second diode from a high voltage breakdown, and is formed on a substrate different from the circuit-specific printed circuit board; and a cooling unit that is joined to the protection circuit outside the circuit-specific printed circuit board and cools the protection circuit.

13 Claims, 9 Drawing Sheets

POWER SUPPLY APPARATUS

FIELD

The present invention relates to a power supply apparatus which has a protection circuit for protecting an electronic component from a high voltage breakdown.

BACKGROUND

Laser power supply apparatuses use high frequencies of 100 kHz to 1 MHz or so as the frequency of their inverter (high frequency inverter circuit). Semiconductor switches typified, for example, by a MOSFET (Metal-Oxide-Semiconductor Field-Effect Transistor) are used as switches in the converter unit and inverter unit of the laser power supply apparatuses.

MOSFETs contain a parasitic diode which occurs parasitically because of the device structure. For the parasitic diode part, it is not always possible to ensure device characteristics. In some cases, in order to prevent a current flow through the parasitic diode, a diode is connected in series to the MOSFET, and a diode different from the parasitic diode (a current-preventing diode for the parasitic diode) is further connected in antiparallel with the MOSFET for use. SBDs (Schottky barrier diodes) are often used as the diodes. With such a MOSFET, the electric current flows through the diode, the drain of the MOSFET, and the source of the MOSFET in order, and through the source of the MOSFET and the current-preventing diode in order. The high frequency inverter circuit for use in a laser power supply apparatus is used with an additional protection circuit (such as a Zener diode) for protecting the diode from a high voltage breakdown. Consequently, when a high voltage is applied to the diode, the protection circuit connected in parallel with the diode provides an electrical connection to suppress overvoltage breakdown of the diode (see patent literature 1).

CITATION LIST

Patent Literature

Patent Literature 1: Japanese Patent Application Laid-open No. 2003-243749

SUMMARY

Technical Problem

The foregoing conventional technology, however, has had a problem that the protection circuit generates heat and a cooling mechanism increases in size in order to prevent the MOSFET from changing in characteristics due to a rise in temperature. The switches in the converter unit and inverter unit of the power supply apparatus sometimes use a plurality of MOSFETs with protection circuits, the MOSFETS being connected in parallel for increased current capacity. The diode forward current has a positive feedback characteristic with respect to temperature increases. The use of diodes connected in parallel thus has had the problem that a current can concentrate on some of the diodes to break the diodes. One method for cooling the protection circuit on a printed circuit board is to put a flexible aluminum bag water-cooling unit into close contact with the printed circuit board. Such a method has had a problem that the water-cooling unit and the circuit elements may have a gap to hinder heat conduction therebetween.

The present invention has been achieved in view of the foregoing, and it is an object thereof to provide a power supply apparatus which suppresses a thermal rise of the protection circuit for stable power supply.

Solution to Problem

In order to solve the aforementioned problems and attain the aforementioned object, the power supply apparatus for supplying a power supply voltage by using a switch element including a transistor, is provided with:

the apparatus comprising: a circuit-specific printed circuit board to be a circuit board that generates the power supply voltage; a first diode that is connected in antiparallel with the transistor and is configured so as to be capable of passing a current through a path to circumvent the transistor; a second diode that is connected in series to the transistor and prevents a current flow through a parasitic diode formed on the transistor; a protection circuit that is connected in parallel with the second diode to protect the second diode from a high voltage breakdown, and is formed on a substrate different from the circuit-specific printed circuit board; and a cooling unit that is joined to the protection circuit outside the circuit-specific printed circuit board and cools the protection circuit.

Advantageous Effects of Invention

The power supply apparatus according to the present invention provides the effect that the thermal rise of the protection circuit can be suppressed for stable power supply since the protection circuit is formed on a substrate different from the circuit-specific printed circuit board and is joined to the cooling unit outside the circuit-specific printed circuit board.

DESCRIPTION OF EMBODIMENTS

Hereinafter, power supply apparatuses according to embodiments of the present invention will be described in detail with reference to the drawings. It should be noted that this invention is not limited by such embodiments. The following embodiments will deal with examples where the power supply apparatus is a laser power supply apparatus to be used for laser output.

First Embodiment

In the present embodiment, protection circuits for semiconductor components are formed on printed circuit boards different from a main printed circuit board to which the semiconductor components to be protected are connected, in order to enhance the cooling capacity of the protection circuits. Conductors electrically connected to the wiring pattern of the main printed circuit board are arranged on the printed circuit boards that constitute the protection circuits. The conductors are thermally connected to cooling fins via a thermally conductive insulator (insulating material) or the like.

Figure 1:
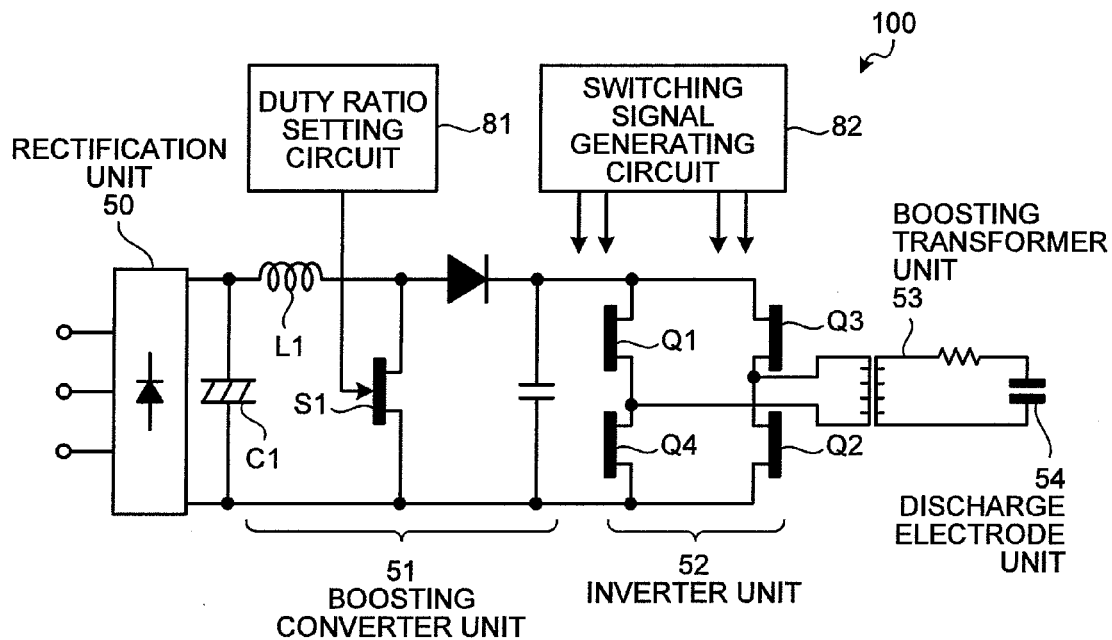
FIG. 1 is a diagram showing the configuration of a power supply apparatus.

FIG. 1 is a diagram showing the configuration of the power supply apparatus. A power supply apparatus 100 includes a rectification unit 50, a boosting converter unit 51, an inverter unit 52, a boosting transformer unit 53, and a discharge electrode unit 54.

The rectification unit 50 rectifies a commercial three-phase alternating-current power supply of 200 V into a pulsating current. The boosting converter unit 51 smoothes the rectified voltage into a direct-current voltage with its smoothing capacitor C1 and inductor L1, and boosts up the voltage. The boosting converter unit 51 includes a switch element S1. The output voltage value of the boosting converter unit 51 can be arbitrarily set by a duty ratio setting circuit 81 changing the duty ratio of the switch element S1.

The inverter unit 52 includes a plurality of switch elements Q1 to Q4 for converting the direct-current voltage boosted by the boosting converter unit 51 into a high frequency. The inverter unit 52 converts the boosted voltage into a high frequency by turning on/off the combinations of the switch elements Q1 and Q2 and the switch elements Q3 and Q4 alternately based on switching signals from a switching signal generating circuit 82. The boosting transformer unit 53 boosts the high frequency voltage that is converted into a high frequency by the inverter unit 52 up to the application voltage for the discharge electrode unit (laser oscillation discharge electrode unit) 54. The discharge electrode unit 54 emits laser, being supplied with the voltage (power supply voltage) boosted by the boosting transformer unit 53. In the power supply apparatus 100, high frequencies of, for example, 100 kHz to 1 MHz or so are used as the frequency of the inverter (high frequency inverter circuit).

While FIG. 1 deals with the case where the power supply apparatus 100 is configured to include the duty ratio setting circuit 81 and the switching signal generating circuit 82, the power supply apparatus 100 need not include the duty ratio setting circuit 81 nor the switching signal generating circuit 82.

Figure 2:
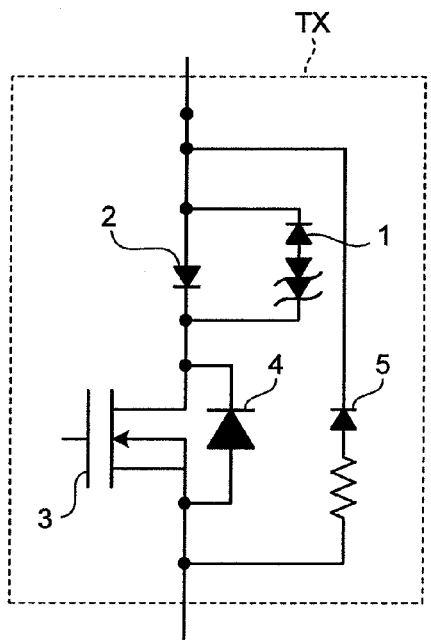
FIG. 2 is a diagram showing the detailed configuration of a switch of a boosting converter unit or an inverter unit.

FIG. 2 is a diagram showing the detailed configuration of a switch of the boosting converter unit or the inverter unit. FIG. 2 shows the configuration of a semiconductor switch TX which the switch elements Q1 to Q4 have. The semiconductor switch TX includes a MOSFET 3, a diode (second diode) 2, a protection circuit 1, and a diode (first diode) 5. The semiconductor switch TX also contains a parasitic diode 4 which occurs parasitically because of the device structure. SBDs (Schottky barrier diodes) are often used as the diodes.

The diode 2 is connected in series to the MOSFET 3 on the drain side of the MOSFET 3. The diode 5 is connected in antiparallel with the MOSFET 3. The protection circuit 1 is a protection circuit element for protecting the diode 2 from a high voltage breakdown. An example is a Zener diode. The protection circuit 1 is connected in parallel with the diode 2. Consequently, when a high voltage is applied to the diode 2, the protection circuit 1 provides an electrical connection to suppress overvoltage breakdown of the diode 2.

Figure 3:
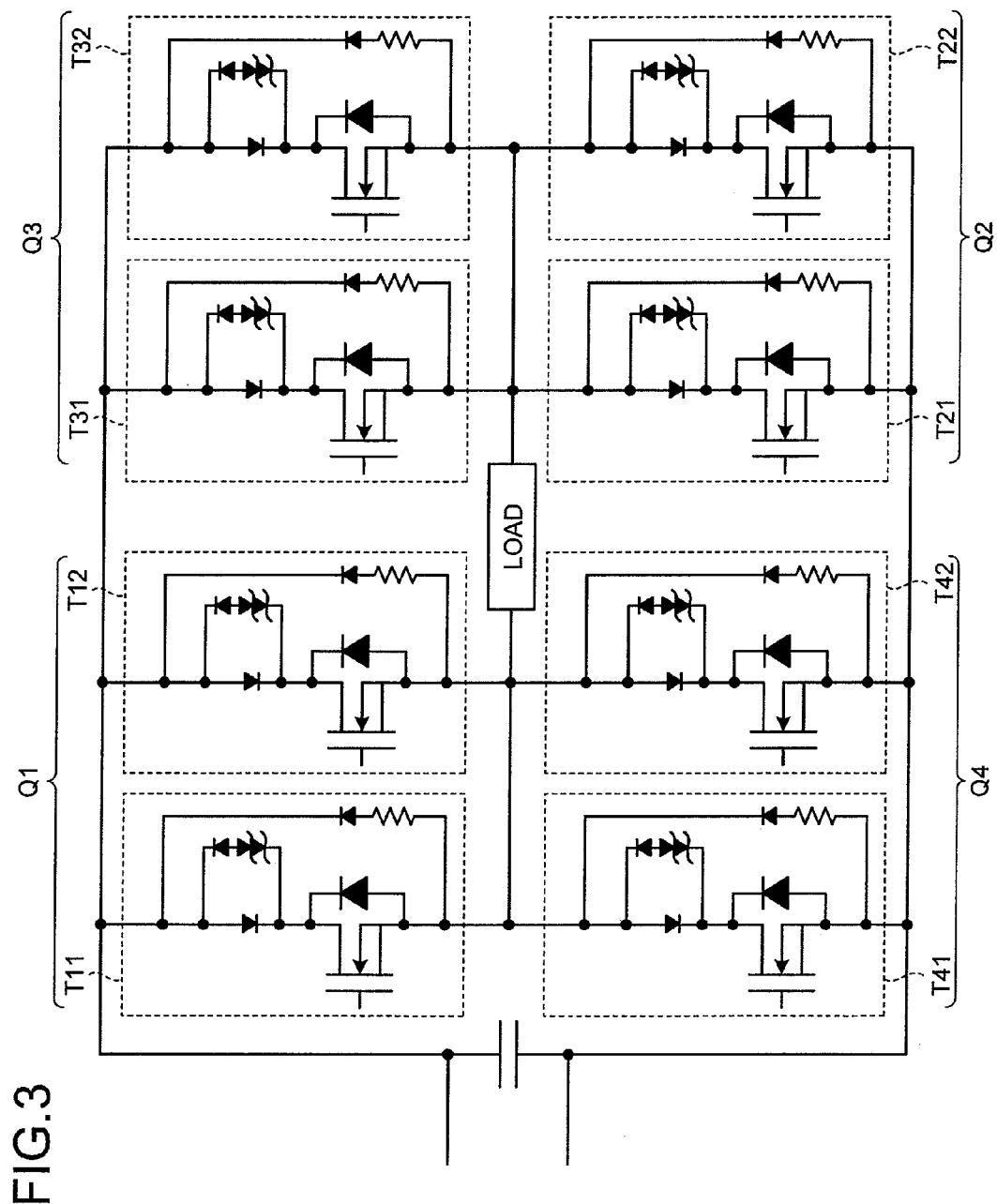
FIG. 3 is a diagram showing an example of the configuration of the inverter unit.

In the power supply apparatus 100, one of semiconductor switches TX shown in FIG. 2 is connected, or a plurality of semiconductor switches TX shown in FIG. 2 are connected in parallel to constitute a single switch element (switch S1, switch elements Q1 to Q4) of the boosting converter unit 51 and the inverter unit 52. Now, an example of the configuration of the inverter unit 52 will be described. FIG. 3 is a diagram showing an example of the configuration of the inverter unit. FIG. 3 shows a case where the switch elements Q1 to Q4 of the inverter unit 52 each include two semiconductor switches TX in parallel.

The switch element Q1 has semiconductor switches T11 and T12 as the semiconductor switches TX. The switch element Q2 has semiconductor switches T21 and T22 as the semiconductor switches TX. The switch element Q3 has semiconductor switches T31 and T32 as the semiconductor switches TX. The switch element Q4 has semiconductor switches T41 and T42 as the semiconductor switches TX.

In the present embodiment, the protection circuit 1 is formed on a printed circuit board intended for the protection circuit 1. Such a protection circuit 1 is attached to a cooling fin to cool the protection circuit 1. The cooling fin may be a water-cooled fin or air-cooled fin. The present embodiment deals with the case of using a water-cooled fin to cool the protection circuit 1 and the like. In the present embodiment, a printed circuit board intended for the diode 2 and a printed circuit board intended for the MOSFET 3 are also attached to water-cooled fins for cooling, along with the printed circuit board intended for the protection circuit 1.

Figure 4:
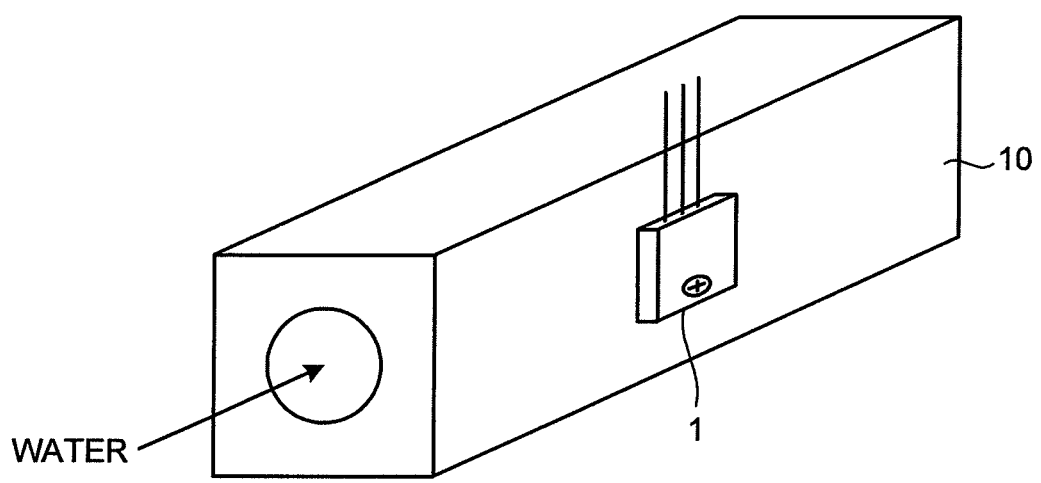
FIG. 4 is a diagram showing an example of the configuration of a water-cooled fin.

FIG. 4 is a diagram showing an example of the configuration of the water-cooled fin. FIG. 4 shows a case where the protection circuit 1 is attached to a cooling fin 10. The cooling fin (cooling unit) 10 has a rectangular solid shape, for example. The column is cylindrically hollowed in the center. Specifically, the cooling fin 10 is cylindrically hollowed through from the top side to the bottom side of the rectangular solid. The protection circuit 1 (printed circuit board intended for the protection circuit) has a generally plate-like shape, and is attached with its main surface in contact with a side surface of the cooling fin 10. Cooling water is fed into the cylindrical hole in the cooling fin 10, whereby the protection circuit 1 is cooled.

In the present embodiment, some of the circuits that constitute the power supply apparatus 100 (circuits other than the semiconductor switches TX) are formed on a printed circuit board intended for the power supply apparatus (main printed circuit board P to be described later). The cooling fin 10 is arranged near the main printed circuit board (circuit-specific printed circuit board) P. The power feed from the capacitor shown in FIG. 2 to the diode 2 and the MOSFET 3 is effected by a conductor pattern (not shown) that is formed inside the main printed circuit board P. The components of the semiconductor switches TX constituting the power supply apparatus 100 are formed on respective different printed circuit boards, and the printed circuit boards are joined to respective cooling fins 10. In the present embodiment, one printed circuit board is joined to one cooling fin 10.

Figure 5:
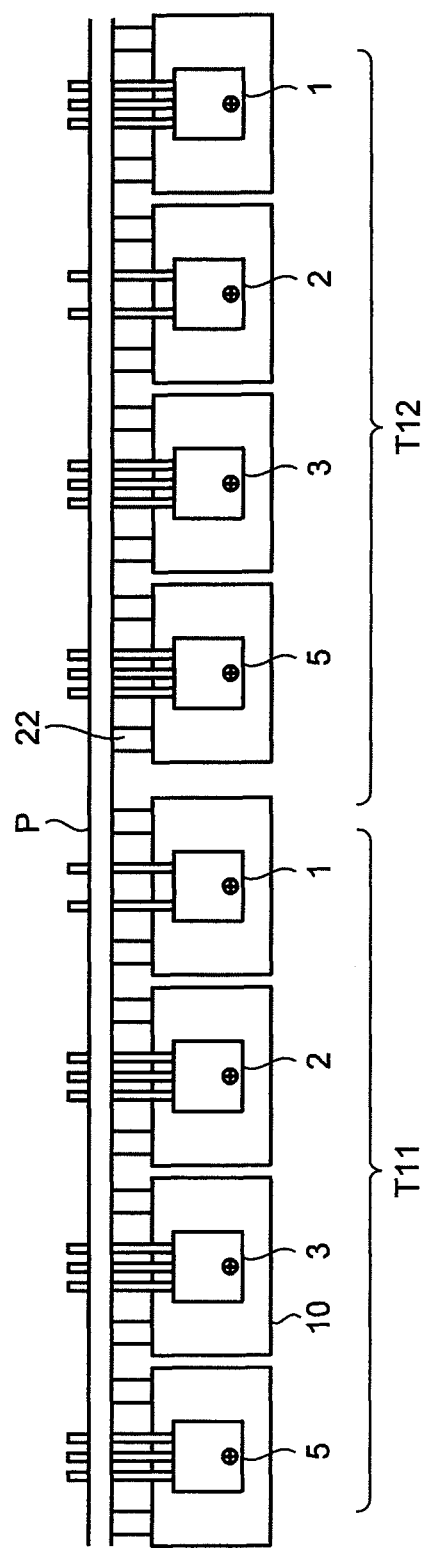
FIG. 5 is a diagram showing the configuration of a main printed circuit board and cooling fins according to a first embodiment.

Next, a description will be given of the configuration of the main printed circuit board P on which the power supply apparatus 100 is formed and the cooling fins 10. FIG. 5 is a diagram showing the configuration of the main printed circuit board and the cooling fins according to the first embodiment. FIG. 5 shows the side surfaces of the main printed circuit board P and the cooling fins 10. The main printed circuit board P and the cooling fins 10 are joined with spacers 22 between the bottom of the main printed circuit board P and the cooling fins 10 (the side surfaces perpendicular to the ones where the protection circuits 1 and the like are attached among the side surfaces of the columns).

One component (printed circuit board) constituting a semiconductor switch TX is joined to one cooling fin 10. FIG. 5 shows a case where the MOSFET 3 (printed circuit board intended for the MOSFET 3), the diode 2 (printed circuit board intended for the diode 2), the protection circuit 1 (printed circuit board intended for the protection circuit 1), and the diode 5 (printed circuit board intended for the diode 5) of the semiconductor switch T11; and the MOSFET 3, the diode 2, the protection circuit 1, and the diode 5 of the semiconductor switch T12 are joined to the respective cooling fins 10. With such a configuration, the MOSFETs 3, the diodes 5, the diodes 2, the protection circuits 1, and the diodes 5 are cooled by the cooling fins 10 through the spacers 22.

Next, a description will be given of the configuration of the joints between the components (parts) of the semiconductor switches TX, such as a protection circuit 1, and the cooling fins 10. Here, the configuration of the joint between a protection circuit 1 and a cooling fin 10 will be described. FIGS. 6 to 11 are diagrams showing the joint between the printed circuit board on which the protection circuit 1 is formed (protection circuit board) and the cooling fin 10, and show the cross-sectional configuration of the joint between the protection circuit board 21 (protection circuit board 21a, 21b) and the cooling fin 10. In the following description, the right side in the diagrams will be referred to as the top side, and the left side in the diagrams as the bottom side.

Figure 6:
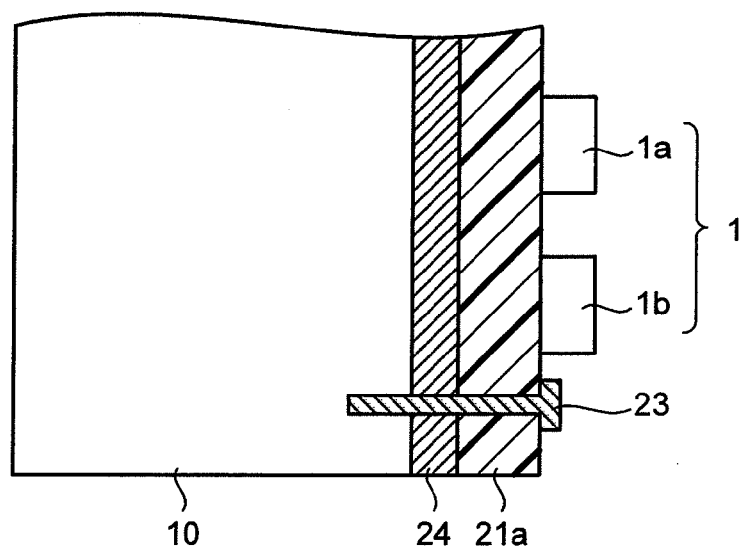
FIG. 6 is a diagram showing the configuration when an internal pattern of a protection circuit board is directly joined to a cooling fin.

FIG. 6 is a diagram showing the configuration when an internal pattern of the protection circuit board is directly joined to the cooling fin. Protection circuit elements 1a and 1b that constitute the protection circuit 1 are formed on the top (right side in the diagram) of the protection circuit board (first substrate) 21a. An internal pattern 24 in connection with the protection circuit elements 1a and 1b is formed on the bottom of the protection circuit board 21a. The internal pattern 24 is joined to the cooling fin 10. In other words, the exposed internal pattern 24 (internal pattern 24 with exposed internal conductors) is directly joined to the cooling fin 10.

The protection circuit board 21a and the like are fixed to the cooling fin 10 with a screw 23 that penetrates through the protection circuit board 21a and the internal pattern 24 from the top side of the protection circuit board 21a to reach the cooling fin 10. This makes it possible to cool the protection circuit 1 with a simple configuration.

Figure 7:
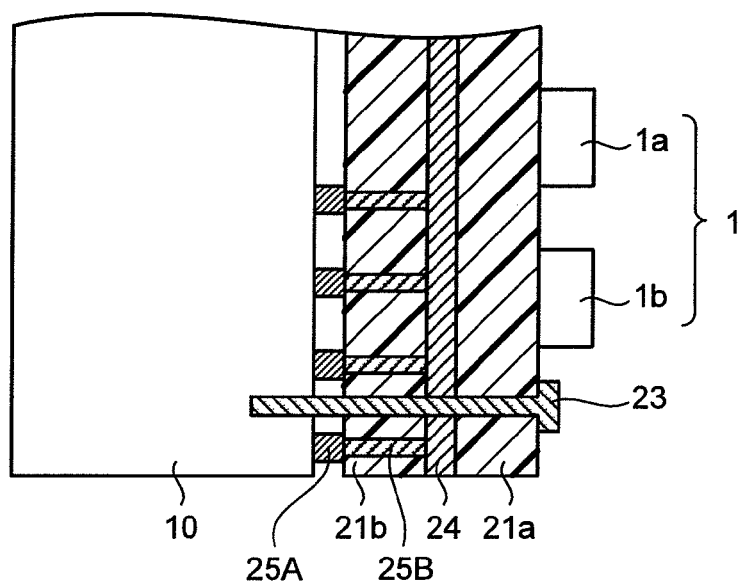
FIG. 7 is a diagram showing the configuration when the backside of the protection circuit board is joined to the cooling fin by conductors of island shape.

FIG. 7 is a diagram showing the configuration when the backside of the protection circuit board is joined to the cooling fin by conductors of island shape. The internal pattern 24 and a bottom-side protection circuit board (second substrate) 21b are formed on the bottom of the protection circuit board 21a. In other words, the internal pattern 24 is formed between the top-side protection circuit board 21a and the bottom-side protection circuit board 21b so as to be sandwiched between the protection circuit boards 21a and 21b. The protection circuit board 21b has one or a plurality of through holes (openings to be through holes) that penetrate through the protection circuit board 21b from the bottom side to the top side. Conductors (first conductor) 25B are embedded in the through holes. The through holes for the conductors 25B to be embedded in are made, for example, by the same method of perforation as the one that is used when forming the protection circuit elements 1a and 1b and the like on the protection circuit board 21a.

The bottom side of the protection circuit board 21b and the cooling fin 10 are joined by conductors (second conductors) 25A. The conductors 25A have an island structure and are joined to the respective conductors 25B. In other words, the conductors 25A are formed in an island shape at positions corresponding to where the respective conductors 25B are arranged. Consequently, the internal pattern 24 is joined to the cooling fin 10 through the conductors 25B embedded in the through holes and the conductors 25A.

The protection circuit board 21a and the like are fixed to the cooling fin 10 with a screw 23 that penetrates through the protection circuit board 21a, the internal pattern 24, and the protection circuit board 21b from the top side of the protection circuit board 21a to reach the cooling fin 10. This makes the substrate on which the protection circuit 1 is formed high in strength. It is possible to cool the protection circuit 1 easily even if the protection circuit 1 is formed on a substrate of high strength.

It should be noted that ring lands for use in forming a circuit on a printed circuit board may be formed on the bottom of the protection circuit board 21b. The ring lands are conductors of flat ring shape, formed around the through holes of the protection circuit board 21b. Since the conductors 25B and the conductors 25A are joined through the ring lands, the bonding between the conductors 25B and the conductors 25A is facilitated. When ring lands are formed on the bottom of the protection circuit board 21b, the ring lands may be used as the conductors 25A.

Figure 8:
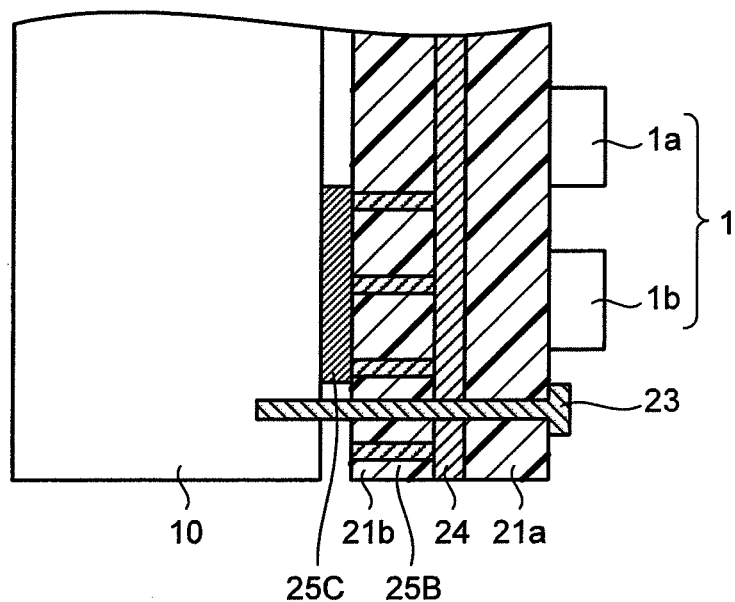
FIG. 8 is a diagram showing the configuration when the backside of the protection circuit board is joined to the cooling fin by a solid pattern of conductor.

FIG. 8 is a diagram showing the configuration when the backside of the protection circuit board is joined to the cooling fin by a solid pattern of conductor. The joint configuration of FIG. 8 differs from that of FIG. 7 in the conductors 25A that join the bottom side of the protection circuit board 21b to the cooling fin 10. Specifically, in the joint configuration of FIG. 8, the bottom side of the protection circuit board 21b and the cooling fin 10 are joined by a solid pattern of conductor 25C (conductor plate). The conductor 25C is thereby joined to the plurality of conductors 25B.

The protection circuit board 21a and the like are fixed to the cooling fin 10 with a screw 23 that penetrates through the protection circuit board 21a, the internal pattern 24, the protection circuit board 21b, the conductor 25C from the top side of the protection circuit board 21a to reach the cooling fin 10. This makes the substrate on which the protection circuit 1 is formed high in strength. It is possible to cool the protection circuit 1 easily with a simple configuration even when the protection circuit 1 is formed on a substrate of high strength.

Figure 9:
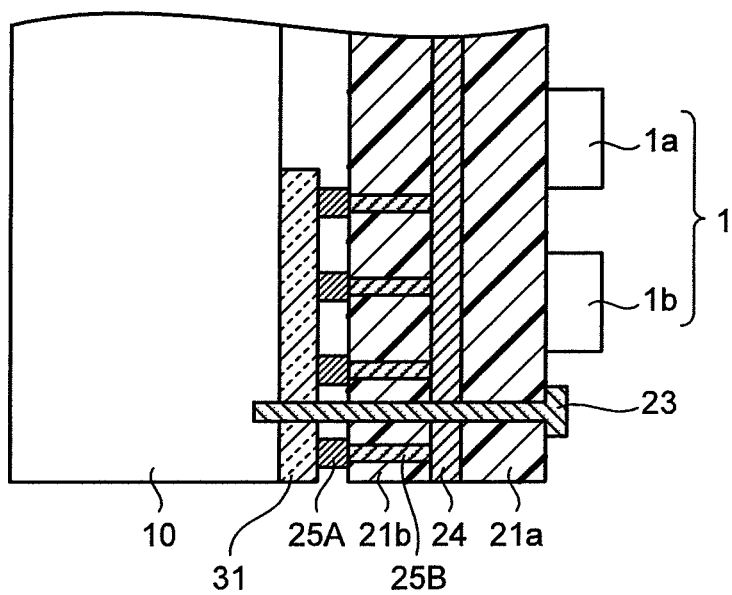
FIG. 9 is a diagram showing the configuration when the backside of the protection circuit board is joined to the cooling fin by conductors of island shape and an insulator.

FIG. 9 is a diagram showing the configuration when the backside of the protection circuit board is joined to the cooling fin by conductors of island shape and an insulator. The joint configuration of FIG. 9 differs from that of FIG. 7 in that an insulator (thermally conductive insulator) 31 is interposed between the conductors 25A and the cooling fin 10.

The protection circuit board 21a and the like are fixed to the cooling fin 10 with a screw 23 that penetrates through the protection circuit board 21a, the internal pattern 24, and the insulator 31 from the top side of the protection circuit board 21a to reach the cooling fin 10. This makes it possible to cool the protection circuit 1 easily even when the cooling fin 10 is not at the same potential as that of the conductors 25B and the like (not grounded).

Figure 10:
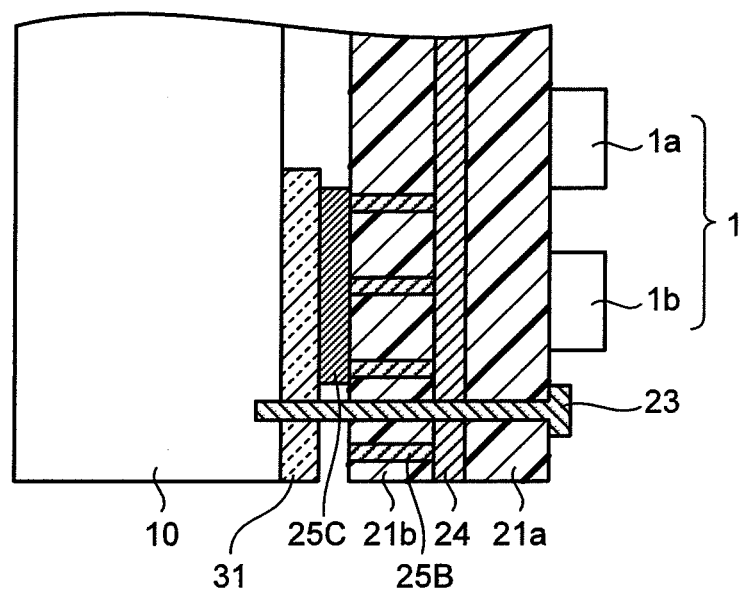
FIG. 10 is a diagram showing the configuration when the backside of the protection circuit board is joined to the cooling fin by a solid pattern of conductor and an insulator.

FIG. 10 is a diagram showing the configuration when the backside of the protection circuit board is joined to the cooling fin by a solid pattern of conductor and an insulator. The joint configuration of FIG. 10 differs from that of FIG. 8 in that the insulator 31 is interposed between the conductor 25C and the cooling fin 10.

The protection circuit board 21a and the like are fixed to the cooling fin 10 with a screw 23 that penetrates through the protection circuit board 21a, the internal pattern 24, the protection circuit board 21b, and the insulator 31 from the top side of the protection circuit board 21a to reach the cooling fin 10. This makes it possible to cool the protection circuit 1 easily with a simple configuration even when the cooling fin 10 is not at the same potential as that of the conductor 25C etc.

Figure 11:
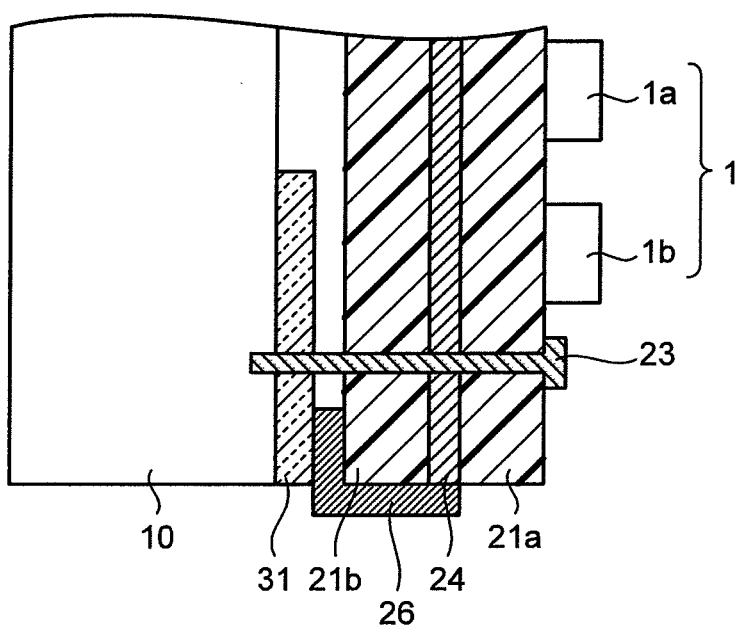
FIG. 11 is a diagram showing the configuration when the internal pattern of the protection circuit board is joined to the cooling fin from a side-surface side of the protection circuit board.

FIG. 11 is a diagram showing the configuration when the internal pattern of the protection circuit board is joined to the cooling fin from the side-surface side of the protection circuit board. The internal pattern 24 and the bottom-side protection circuit board 21b are formed on the bottom of the protection circuit board 21a. An L-shaped conductor (third conductor) 26 is joined to a surface (side surface) of the internal pattern 24 where neither of the protection circuit boards 21a and 21b is joined. The conductor 26 extends from the joint position of the internal pattern 24 to the side of the cooling fin 10 along the side surface (outer wall surface) of the protection circuit board 21b, turns at the bottom of the protection circuit board 21b (the top of the insulator 31), and is joined to the top side of the insulator 31. In other words, the conductor 26 is connected to the side surface of the internal pattern 24 and extends from the side surface of the protection circuit board 21b to the bottom of the protection circuit board 21b.

The protection circuit board 21a and the like are fixed to the cooling fin 10 with a screw 23 that penetrates through the protection circuit board 21a, the internal pattern 24, the protection circuit board 21b, and the insulator 31 from the top side of the protection circuit board 21a to reach the cooling fin 10. This makes it possible to cool the protection circuit 1 with a simple configuration without using a through hole even when the protection circuit 1 is formed on a substrate of high strength.

It should be noted that the joint configurations shown in FIGS. 6 to 11 may be combined in various ways. For example, the joint configuration shown in FIG. 6 may include an insulator 31. In such a case, the insulator 31 is interposed between the internal pattern 24 and the cooling fin 10. In the joint configuration shown in FIG. 11, the insulator may be omitted. In such a case, the conductor 26 is directly joined to the cooling fin 10.

The cooling fin 10 may be either a water-cooled fin or an air-cooled fin. If the surrounding environment of the power supply apparatus 100 contains a lot of metal powder or the like, the use of an air-cooled fin entails a filter for removing the metal powder contained in the air flow that reaches the air-cooled fin.

FIGS. 2, 3, 5, and the like have dealt with the case where each semiconductor switch TX includes one MOSFET 3. In a possible configuration, however, each semiconductor switch TX may include a plurality of MOSFETs 3.

The present embodiment has dealt with the case where the MOSFETs 3, the diodes 2, the protection circuits 1, and the diodes 5 are formed on the respective different printed circuit boards (chips). However, some of the MOSFETs 3, the diodes 2, the protection circuits 1, and the diodes 5 may be formed on the same printed circuit board. For example, the diodes 2 and the protection circuits 1 may be formed on the same printed circuit board, and the printed circuit board may be connected to the cooling fin 10.

The present embodiment has dealt with the case where the protection circuits 1 and the diodes 2 are formed on printed circuit boards, whereas the protection circuits 1 and the diodes 2 may be formed on substrates (such as a semiconductor substrate) other than printed circuit boards.

Conventionally, the protection circuit for protecting a diode has been formed on a printed circuit board. There has been a problem, however, that the protection circuit rises in temperature because of heat generation from the electronic components that constitute the protection circuit, such as a Zener diode. In contract, in the present embodiment, the heat generated by the protection circuit elements 1a and 1b can be transferred to the cooling fin 10 through a path consisting of the internal conductors of the protection circuit board 21 (such as the internal pattern 24 and the conductors 25B), the surface conductors of the protection circuit boards 21a and 21b (such as the conductors 25A, 25C, and 26), and the cooling fin 10. This allows effective cooling of the protection circuit.

As described above, according to the first embodiment, the protection circuits 1 are formed on the protection circuit boards 21, and the protection circuit boards 21 are cooled by the cooling fins 10. This makes it possible to suppress a thermal rise of the protection circuits 1 and provide a stable power supply with high efficiency.

Second Embodiment

Figure 14:
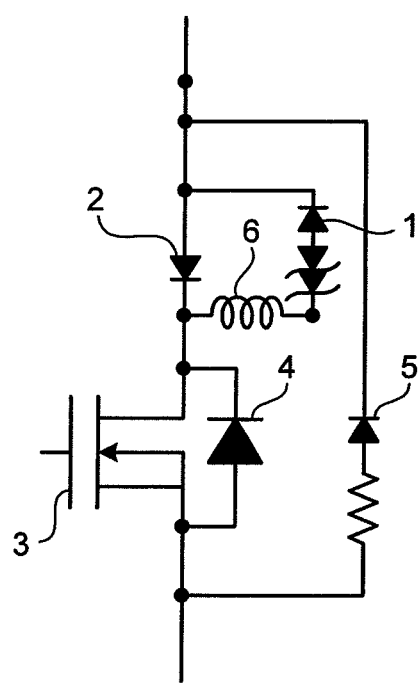
FIG. 14 is a diagram for explaining a floating inductance that occurs between a diode and a protection circuit.

Next, a second embodiment of this invention will be described with reference to FIGS. 12 and 14. In the second embodiment, a plurality of protection circuits 1 connected in parallel are not connected to respective separate cooling fins 10 but to the same cooling fin 10 in order to suppress variations in characteristics because of differences in temperature between the plurality of protection circuits 1 connected in parallel.

Diode characteristics have a temperature dependence. It is therefore desirable that the diodes 2 and the protection circuits 1 be operated at temperatures as the same as possible. For that purpose, in the present embodiment, the diodes 2 and the protection circuits 1 are arranged on the same cooling fin 10. When a single switch element (switch elements Q1 to Q4) uses diodes 2 and protection circuits 1 connected in parallel, a current can concentrate on a diode of higher temperature due to the diode characteristics if the plurality of diodes 2 and protection circuits 1 connected in parallel have respective different temperatures. This may result in a breakdown of the diode. In the present embodiment, the diodes 2 and the protection circuits 1 connected in parallel are therefore arranged on the same cooling fin 10. In other words, a group of components that constitute a single switch element (diodes 2 and protection circuits 1) are connected to the same cooling fin 10.

Figure 12:
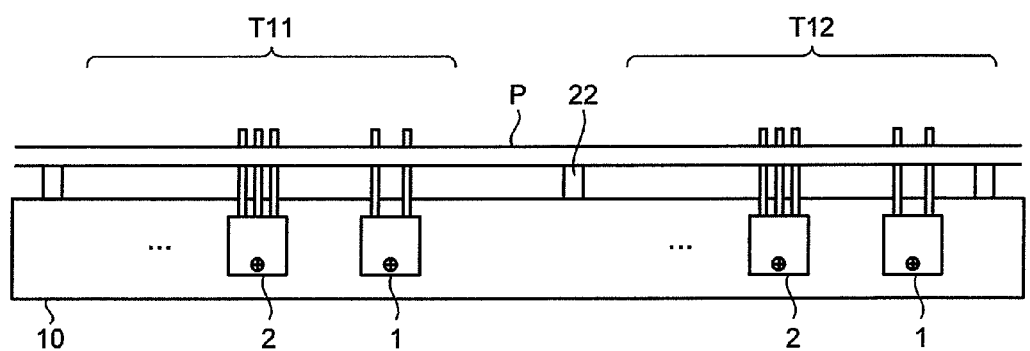
FIG. 12 is a diagram showing the configuration of a main printed circuit board and a cooling fin according to a second embodiment.

FIG. 12 is a diagram showing the configuration of the main printed circuit board and the cooling fin according to the second embodiment. FIG. 12 shows the side surfaces of the main printed circuit board P and the cooling fin 10. The main printed circuit board P and the cooling fin 10 are joined with spacers 22 between the bottom of the main printed circuit board P and a side surface of the cooling fin 10.

The protection circuits 1 and the diodes 2 in the group of semiconductor switches TX that a single switch element has (the protection circuits 1 and diodes 2 connected in parallel in the switch element) are joined to a single cooling fin 10. FIG. 12 shows a case where a group of components (protection circuits 1 and diodes 2) of the switch element Q1 are joined to the single cooling fin 10. Specifically, the diode 2 of the semiconductor switch T11, the protection circuit 1 of the semiconductor switch T11, the diode 2 of the semiconductor switch T12, and the protection circuit 1 of the semiconductor switch T12 are joined to the single cooling fin 10.

With such a configuration, the protection circuits 1 and diodes 2 that constitute the same switch element are cooled by the same cooling fin 10. This makes it possible to suppress variations in characteristics due to differences in temperature between the plurality of protection circuits 1 and diodes 2 that are connected in parallel in the same switch element.

Figure 13:
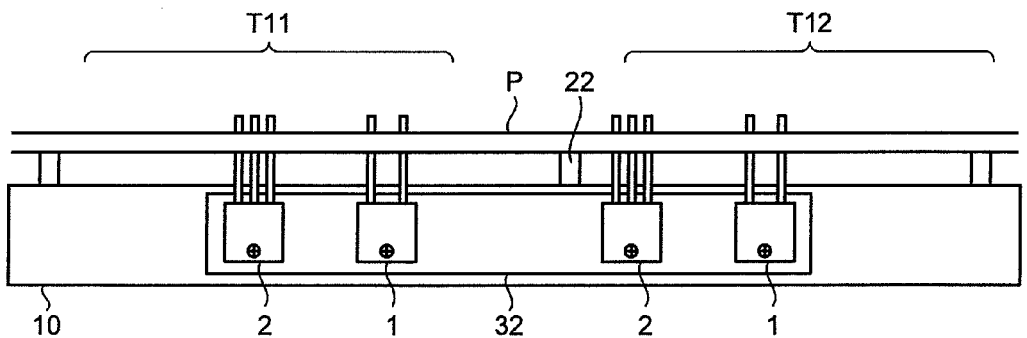
FIG. 13 is a diagram showing the configuration when a group of semiconductor switches that constitute a single switch element are arranged on the same insulator.

A group of semiconductor switches TX that constitute a single switch element may be arranged on the same insulator 32. FIG. 13 is a diagram showing the configuration when a group of semiconductor switches constituting single a switch element are arranged on the same insulator. It should be noted that the MOSFETs 3 and diodes 5 of the semiconductor switches T11 and T12 are omitted in FIG. 13.

In FIG. 13, the diode 2 of the semiconductor switch T11, the protection circuit 1 of the semiconductor switch T11, the diode 2 of the semiconductor switch T12, and the protection circuit 1 of the semiconductor switch T12 connected in parallel are arranged on a common insulator 32 which is interposed between the components and the cooling fin 10. Using a high thermal conductivity member for the insulator 32 can reduce differences in temperature between the protection circuits 1 and diodes 2 that constitute a single switch element.

By the way, when the power supply apparatus 100 is used as a laser power supply apparatus, the operating frequency is as high as 100 kHz to 1 MHz or so. High speed devices that make a switching operation in several tens of nanoseconds to several hundreds of nanoseconds or so, such as MOSFETs 3, are therefore used for the switch elements of the inverter unit. In such a case, the diodes 2 connected in series to the MOSFETs 3 also undergo changes in voltage and in current with frequencies equivalent to the switching speed of the MOSFETs 3. If a protection circuit 1 is connected to a diode 2 by a long wiring path, a floating inductance 6 as shown in FIG. 14 (a floating inductance component connected in series to the protection circuit 1) sometimes occurs between the diode 2 and the protection circuit 1. If the floating inductance 6 is high, the voltage applied to the Zener diodes that constitute the protection circuit 1 decreases since some of the voltage is applied to the floating inductance 6 when the MOSFET 3 is turned on/off. This can delay the electrical connection of the Zener diodes and the operation of the protection circuit 1, so that an excessive voltage is sometimes applied to the diode 2. As a result, the diode 2 may be broken due to the delayed operation of the protection circuit 1.

Then, in the present embodiment, the diodes 2 and the protection circuits 1 are arranged next to each other on the same cooling fin 10. Such a configuration reduces the wiring distances from the protection circuits 1 to the diodes 2. This can suppress the floating inductances 6 occurring between the diodes 2 and the protection circuits 1, and prevent the diodes 2 from undergoing an excessive voltage.

The present embodiment has dealt with the case where the diodes 2 and the protection circuits 1 connected in parallel are arranged on the same cooling fin 10. However, the protection circuit 1 and the diode 2 of a single semiconductor switch may be arranged on the same cooling fin 10 so that the protection circuits 1 and the diodes 2 connected in parallel may be arranged on different cooling fins 10 from one semiconductor switch TX to another. In other words, the protection circuit 1 and the diode 2 that constitute a single semiconductor switch TX may be arranged on a single cooling fin 10, while the semiconductor switches TX are arranged on respective different cooling fins 10. Otherwise, all the protection circuits 1 and the diodes 2 that constitute the switch elements Q1 to Q4 may be connected to the same cooling fin 10. The MOSFETs 3 and the diodes 5 may also be connected to the same cooling fin 10 along with the protection circuits 1 and the diodes 2.

As described above, according to the second embodiment, the protection circuits 1 and the diodes 2 that constitute a single switch element are connected to the same cooling fin 10. This can reduce differences in temperature between the protection circuits 1 and diodes 2 that constitute a single switch element. Consequently, it is possible to prevent the occurrence of current concentration on a diode 2 or protection circuit 1 because of variations in temperature.

Since the diodes 2 and the protection circuits 1 are arranged next to each other on the same cooling fin 10, it is possible to suppress floating inductances 6 that occur between the diodes 2 and the protection circuits 1. As a result, it is possible to prevent the application of an excessive voltage to the diodes 2.

The foregoing first and second embodiments have dealt with the MOSFETs 3 of the inverter unit 52, the diodes 2 connected in series to the MOSFETs 3, and the protection circuits 1 connected in parallel with the diodes 2. However, the foregoing first and second embodiments may be applied to the MOSFET 3 of the boosting converter unit 51, the diode 2 connected in series to the MOSFET 3, and the protection circuit 1 connected in parallel with the diode 2. Even in such a case, the same effects as with the inverter unit 52 are provided. The conductors 25A to 25C and 26 and the internal pattern 24 used in the first and second embodiments may be insulators with high thermal conductivity.

INDUSTRIAL APPLICABILITY

As described above, the power supply apparatus according to the present invention is suitable for cooling a protection circuit that is intended to protect an electronic component from a high voltage breakdown.

REFERENCE SIGNS LIST

1 PROTECTION CIRCUIT
1a, 1b PROTECTION CIRCUIT ELEMENT
2 DIODE
3 MOSFET
4 PARASITIC DIODE
5 DIODE
6 FLOATING INDUCTANCE
10 COOLING FIN
21a, 21b PROTECTION CIRCUIT BOARD
22 SPACER
23 SCREW
24 INTERNAL PATTERN
25A to 25C, 26 CONDUCTOR
31, 32 INSULATOR
50 RECTIFICATION UNIT
51 BOOSTING CONVERTER UNIT

52 INVERTER UNIT
53 BOOSTING TRANSFORMER UNIT
54 DISCHARGE ELECTRODE UNIT
100 POWER SUPPLY APPARATUS
P MAIN PRINTED CIRCUIT BOARD
Q1 to Q4 SWITCH ELEMENT
T11, T12, T21, T22, T31, T32, T41, T42, TX SEMICONDUCTOR SWITCH

The invention claimed is:

1. A power supply apparatus for supplying a power supply voltage by using a switch element including a transistor, the apparatus comprising:
 a circuit-specific printed circuit board to be a circuit board that generates the power supply voltage;
 a first diode that is connected in antiparallel with the transistor and is configured so as to be capable of passing a current through a path to circumvent the transistor;
 a second diode that is connected in series to the transistor and prevents a current flow through a parasitic diode formed on the transistor;
 a protection circuit that is connected in parallel with the second diode to protect the second diode from a high voltage breakdown, and is formed on a substrate different from the circuit-specific printed circuit board; and
 a cooling unit that is joined to the protection circuit outside the circuit-specific printed circuit board and cools the protection circuit.

2. The power supply apparatus according to claim 1, further comprising an insulation unit that is interposed between the cooling unit and the protection circuit to insulate the cooling unit and the protection circuit from each other.

3. The power supply apparatus according to claim 1, wherein: the second diode and the protection circuit that are connected to the same transistor are joined to the same cooling unit; and the cooling unit cools the protection circuit and the second diode.

4. The power supply apparatus according to claim 1, wherein: the second diode and the protection circuit that are connected in parallel in the one switch element are joined to the same cooling unit; and the cooling unit cools the protection circuit and the second diode.

5. The power supply apparatus according to claim 3, wherein the second diode and the protection circuit that are connected to the same cooling unit are joined to the cooling unit through the same insulation unit.

6. The power supply apparatus according to claim 3, wherein the protection circuit and the second diode are arranged next to each other on the cooling unit.

7. The power supply apparatus according to claim 1, wherein:
 the substrate on which the protection circuit is formed has an internal pattern that is connected to the protection circuit, the internal pattern being formed on a bottom of the substrate; and
 the internal pattern and the cooling unit are joined to each other, whereby the protection circuit is joined to the cooling unit through the internal pattern.

8. The power supply apparatus according to claim 1, wherein:
 the substrate on which the protection circuit is formed includes a first substrate on which the protection circuit is mounted, an internal pattern that is connected to the protection circuit at a bottom of the first substrate, a second substrate between which and the first substrate the internal pattern is sandwiched, a first conductor that is embedded in an opening formed in the second substrate from a bottom side to the internal pattern and is joined to the internal pattern, and a second conductor that is arranged on the bottom of the second substrate and joined to the first conductor; and
 the second conductor and the cooling unit are joined to each other, whereby the protection circuit is joined to the cooling unit through the internal pattern, the first conductor, and the second conductor.

9. The power supply apparatus according to claim 8, wherein the second conductor is formed in an island shape in a position corresponding to arrangement of the first conductor, for each position of arrangement of the first conductor.

10. The power supply apparatus according to claim 8, wherein the second conductor is formed in a solid pattern so as to be joined to a plurality of the first conductor.

11. The power supply apparatus according to claim 1, wherein:
 the substrate on which the protection circuit is formed includes a first substrate on which the protection circuit is mounted, an internal pattern that is connected to the protection circuit at a bottom of the first substrate, a second substrate between which and the first substrate the internal pattern is sandwiched, and a third conductor that is connected to a side of the internal pattern and extends from a side of the second substrate to the bottom of the second substrate; and
 the third conductor and the cooling unit are joined to each other, whereby the protection circuit is joined to the cooling unit through said internal pattern and said third conductor.

12. The power supply apparatus according to claim 4, wherein the second diode and the protection circuit that are connected to the same cooling unit are joined to the cooling unit through the same insulation unit.

13. The power supply apparatus according to claim 4, wherein the protection circuit and the second diode are arranged next to each other on the cooling unit.

* * * * *